United States Patent [19]

Leavey et al.

[11] Patent Number: 5,843,196
[45] Date of Patent: Dec. 1, 1998

[54] ULTRA-CLEAN TRANSPORT CARRIER

[75] Inventors: Jeffrey A. Leavey, Poughkeepsie; David S. Feikert, North Syracuse, both of N.Y.

[73] Assignee: International Business Machines Corporation, Armonk, N.Y.

[21] Appl. No.: 784,557

[22] Filed: Jan. 21, 1997

[51] Int. Cl.$^6$ .................................................. B01D 50/00
[52] U.S. Cl. .................... 55/356; 55/385.1; 55/385.2; 55/418; 55/471; 206/710; 454/192
[58] Field of Search ................. 55/385.1, 385.2, 55/385.6, 356, 418, 471, 472; 454/187, 195, 238, 192; 206/710, 711

[56] References Cited

U.S. PATENT DOCUMENTS

| | | | |
|---|---|---|---|
| 4,037,830 | 7/1977 | Poluzzi et al. | 55/385.2 |
| 4,609,103 | 9/1986 | Bimer et al. | 206/328 |
| 4,666,479 | 5/1987 | Shoji | 55/385 R |
| 4,724,874 | 2/1988 | Parikh et al. | 55/385.1 |
| 4,770,680 | 9/1988 | Machida et al. | 55/385.1 |
| 4,804,086 | 2/1989 | Grohrock | 206/328 |
| 4,961,766 | 10/1990 | Hogan | 55/385.2 |
| 4,963,069 | 10/1990 | Wurst et al. | 55/385.1 |
| 5,025,924 | 6/1991 | Watanabe | 206/334 |
| 5,219,464 | 6/1993 | Yamaga et al. | 55/385.1 |
| 5,346,518 | 9/1994 | Baseman et al. | 55/267 |
| 5,380,503 | 1/1995 | Fujii et al. | 95/95 |

OTHER PUBLICATIONS

Anonymous, "Clean Wafer Transportation" Research Disclosure, No. 289, Kenneth Mason Publications Ltd., England, May 1966.

*Primary Examiner*—Duane S. Smith
*Attorney, Agent, or Firm*—H. Daniel Schnurmann

[57] ABSTRACT

A transport carrier for transporting x-ray masks, wafers and the like, from an ultra-clean environment to another through a lesser clean environment. The apparatus includes a box that is sealed from the outside by an access door, one or more fans, at least one air filter, rechargeable batteries or a continuous voltage supply for powering the fans. It also includes a damper mechanism for maintaining a positive air pressure when the access door opens. The damper also secures recirculating air inside the box when the door closes. The recirculating air is continuously cleaned at a rate of 2,000 times/minute. The air filter is placed horizontally, preferably, over a frame facing the product to be transported to ensure a continuous smooth, laminar flow.

32 Claims, 8 Drawing Sheets

ULTRA-CLEAN TRANSPORT CARRIER

FIELD OF THE INVENTION

This present invention relates to a transport carrier providing an ultra-clean environment to sensitive products being moved from one ultra-clean area to another ultra-clean area while passing through a lesser clean area, and the storage of these products in less clean areas.

BACKGROUND OF THE INVENTION

In line with the ever increasing density and complexity of semiconductor integrated circuits brought about by the advent of ULSI (Ultra-large-scale-integration), circuit patterns sizes used in the manufacture of integrated devices continue to decrease to sub-micron sizes. Accordingly, contamination by particles and chemicals generated during the manufacturing of these integrated devices cause serious reliability problems which potentially can have a negative effect on yields. In order to forestall problems of this nature, ULSI circuits are commonly manufactured in a clean room environment, wherein the level of particulate and chemical contaminants allowed to be present is a function of the groundrules used by a given technology.

Ultra-clean environments are particularly important to proximity X-ray semiconductor lithography, optical semiconductor lithography, pharmaceutical and surgical device manufacturing, and other such industries requiring high levels of cleanliness.

In the area of semiconductor lithography, X-rays are used as the light source for making very small (e.g., sub-0.25 micron) features using the technique of proximity printing, wherein photomask and semiconductors are placed in close proximity of each other before the exposure us made. The space, or gap, between the photomask and semiconductor wafer may be as small as 5 micrometers ($\mu$m) (a human hair is approximately 75 $\mu$m in diameter). The photomask consists of a thin membrane (typically 2 to 5 $\mu$m thick) that is extremely fragile. This membrane will break if a particle larger than the photomask/wafer gap were to be present, or allowed to enter the photomask/wafer gap. The danger of membrane breakage requires that masks and wafers remain in an ultra-clean environment at all times. The fragility of the membrane also precludes the use of most cleaning techniques, thus emphasizing the need for preventing contamination from occurring.

For optical lithography, wherein photomask and wafer gaps are substantially larger, cleanliness is still a concern to obtain high chip yields on wafers. As features shrink in size, cleanliness of the environment becomes more important as the effect of contamination becomes more noticeable on semiconductor wafer yields.

In the medical field, cleanliness is essential to provide a sterile environment for pharmaceutical and surgical device manufacturing. Particulates can act as microbial carriers which can generate complications during the healing process. Accordingly, surgical suites are built today as clean rooms.

Because clean room construction and maintenance costs have increased significantly while the clean class has decreased (e.g., from class 1,000 to class 1 and better), industries sensitive to contamination have gravitated towards building facilities at a higher class (i.e., less clean) and subsequently using lower class (i.e., cleaner) mini-environments around the tooling for protecting the product. A problem arises when the product requires to be transported from one clean work station to another passing through a less clean area, which exposes the product to an unacceptable level of contaminants.

Transport carriers of products requiring a clean environment may take several forms, shapes and dimensions. They may be specially designed carts and/or wheeled containers or they may be hand carried transports.

Following are several examples of representative prior art transport containers:

Described in U.S. Pat. No. 4,804,086 to Grohrock, is a carrier provided with an interchangeable inside compartment; with one or more filter elements that ensure a particle-free air pressure equalization between inside and outside the carrier (i.e., if the outer pressure exceeds the inner pressure, air entering the box is forced through the filter). As such, no active air (i.e. forced air flow) filtration is provided. To remove the product, the container needs to be opened. This is achieved by separating the bottom element holding the product from the top cover, exposing the inside of the container to contaminates in the environment or contaminates on the clothing of the person reaching into the carrier to remove the product.

Described in U.S. Pat. No. 4,666,479, to Kikuchi Shoji, is a semiconductor wafer container having an air filter for removing particles from the air, and allowing air to pass through a body of the container, equalizing the pressure within and without the container. Although the container is described without active air filtration, the filter allows air pressure to be effectively equalized inside and outside the container. No means are provided to prevent outside contaminates from entering when the container is opened or contaminates on the clothing of the person reaching into the carrier to remove the product.

In U.S. Pat. No. 4,770,680, issued to Akira Machida, et al., air from the outside is drawn into the container through a filter, passing through the product before exiting the transport. Only "once through" active air flow (i.e., air entering the container, exits the container without recirculating) is provided, although no physical isolation or protection of the product from the environment is present.

In another example, in U.S. Pat. 4,609,103 to Bimer, the top opens up, exposing the product to the environment which allows contaminants to penetrate the box. It provides only stagnant air (i.e., not recirculated) to the product, wherein the filter mainly acts as a pressure equalizer between the inside and the outside of the box. Unfortunately, the reverse does not hold true, leaving the product exposed to contaminants when the door opens. In this example, there is provided a container that has no active air filtration other than an air filter for equalizing air pressure inside and outside the container. Contaminates are allowed to enter when the container is opened or contaminants falling from the clothing of a person reaching into the carrier to remove the product.

Figure 1:
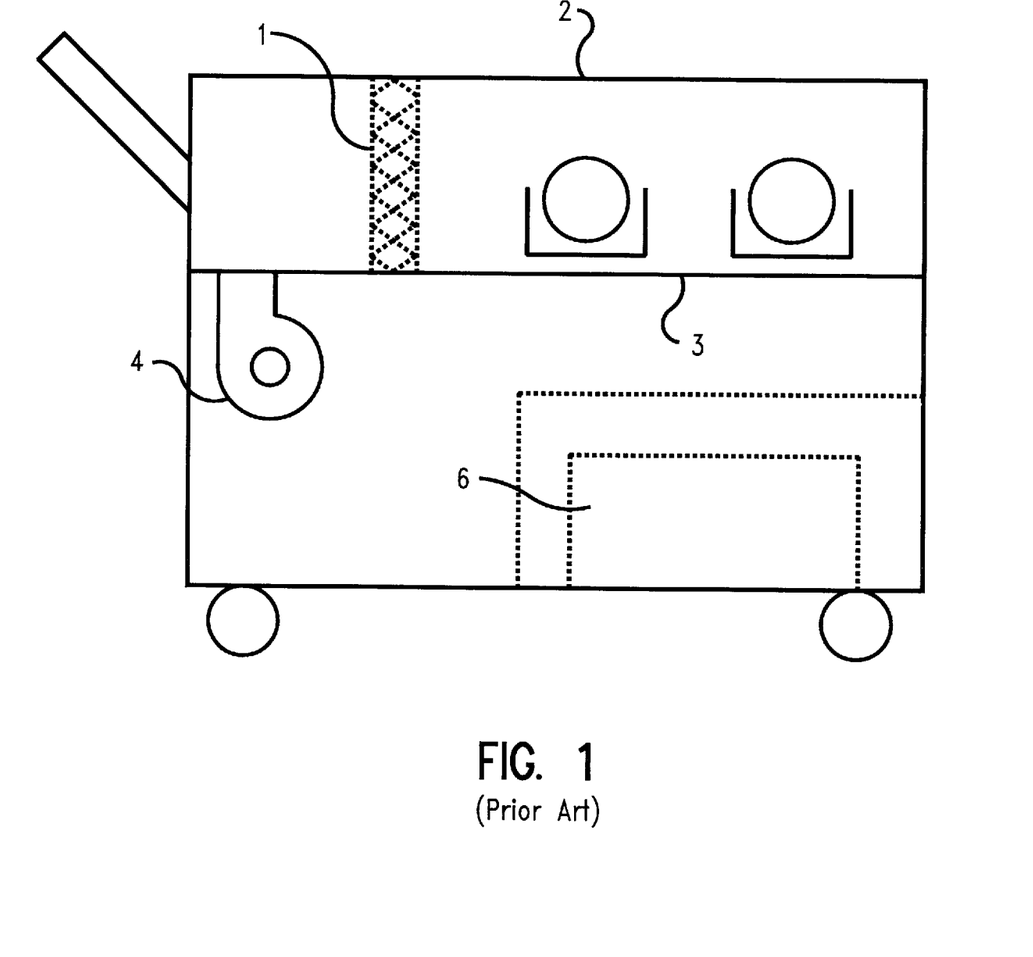
FIG. 1 is a schematic view of a prior art clean wafer transport.

State of the art clean transport containers are typically provided with one or several features which are best described with reference to FIG. 1. Shown is a schematic diagram of a clean wafer transport cart providing a clean environment to wafers that need to be transported from a first clean room to a second, passing through a less clean area.

The cart delivers air at a rate of 100 rpm, filtering particles to a size of 0.12 micron by means of a HEPA filter 1. A top enclosure 2, preferably transparent, provides for visual observation of the wafers within the cart. The enclosure has, preferably, a side access to load and unload the wafers. A perforated metal base 3 with vibration isolation absorbs traveling shock and provides a return air path to blower 4 supplying air to the filter 1. The cart contains a power source and associated circuitry 6. The cart is dimensioned to pass through and out of conventional clean room areas. Blower 4 blows the contaminated air through filter 1, extracting the particulates. The contaminated air is recirculated by blower 4.

In summary, whereas the aforementioned types of transports have proved to be adequate for some applications by reducing the number of particles entering and/or recirculating within the confines of the container, they have proven inadequate for applications requiring at the very least a class 1 clean environment. This is particularly true for X-ray masks, wherein ultra-clean transportation and storage are of critical importance for preventing the mask membrane breakage described above.

Additionally, a major problem associated with some prior art transport carriers resides in their ability to provide only a stagnant environment with an air quality only as good as the air which is confined inside the container once the door closes to the product.

A further major problem associated with prior art carriers that recirculate air resides in their inability to prevent outside air from entering the carrier when opened, thereby contaminating the inside of the carrier and the product from the environment, or from contaminants falling from the clothing of a person reaching into the carrier to remove the product.

OBJECTS OF THE INVENTION

Accordingly, it is an object of the present invention to provide a sealable transport container for providing a class 1 or better environment for particulates.

It is another object of the invention to reduce the number of particulates within the confines of the transport container to those having dimensions less than 0.12 Mm, with an efficiency of the order of 99.999% or better, or to the size and efficiency required by the application of the container.

It is another object of the invention to reduce the levels of chemical contaminants within the container to those required by the application of chemical filtration.

It is yet another object of the invention to provide the transport container with active air cleaning features to continually improve the quality of the environment within the confines of the container.

It is still another object of the invention to force clean air from within the container to flow out the doorway, thereby preventing contamination of the product inside the container or the insides of the container itself.

It is a more particular object of the invention to provide the transport container with a damper mechanism activated by the door to switch the air flow from recirculation to "once through", thereby forcing the air out of the container when the door opens.

SUMMARY OF THE INVENTION

These and other objects of the invention are accomplished by a transport and storage carrier that includes: a sealable box having an access door, the sealable door being sealed when the door is in a closed position; and air circulating means for creating a positive air pressure in the box and from circulating air in the box when the box is in its closed position.

The circulating means are provided by one or more fans, which are controlled by a damper mechanism serving a dual purpose: it recirculates air when the access door is closed, and pushes clean air outwardly when the door opens.

BRIEF DESCRIPTION OF THE DRAWINGS

The invention will be described in greater detail by referring to the attached drawings and description of the embodiment that follows.

DETAILED DESCRIPTION OF THE INVENTION

Figure 2:
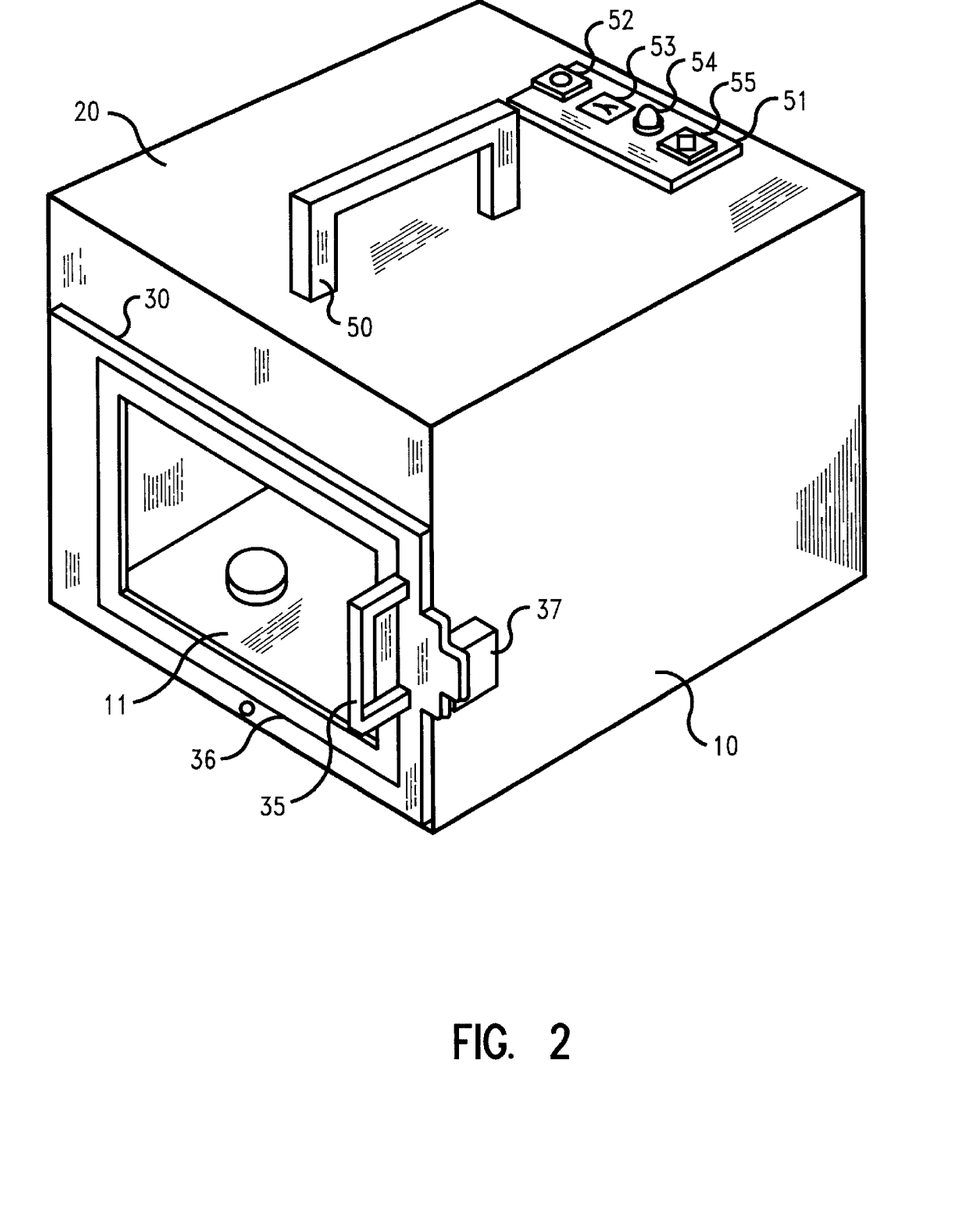
FIG. 2 is a perspective view of the transport container in accordance with a preferred embodiment of the present invention.

FIG. 2 shows a perspective view of the clean transport container viewed from the front and constructed in accordance with the preferred embodiment of the invention.

The transport container 10 includes a housing body, preferably in the shape of a box, with a removable top cover 20. The removable cover allows easy access to the major components of the container, such as the high efficiency particulate air (HEPA) or ultra-low particulate air (ULPA) filter, chemical removal filter if included, fans and electrical wiring, all of which will be described in detail hereinafter. Preferably, the box is 12" wide by 14" deep and 10" high and, typically, weights approximately 12 lbs., allowing an operator to carry it with one hand. Practitioners of the art will readily appreciate that the box size can be adjusted to allow a large variety of products to be hand carried.

The box cover 20 is provided with a carrying handle 50 that folds down when not in use and a control area 51 at the rear edge. The control area contains a battery recharging connector 52, a battery condition meter 53, a pilot light 54, and an ON/OFF switch 55. The location of these controls is a matter of operator convenience.

The door 30 is provided with a door pull 35 and a catch 37, and is permanently attached to the box, preferably, with a continuous hinge. It is important that the door hinge and catch be positioned outside the door gasket 36 to eliminate any possible contaminants from entering the product compartment 11. It is also important that the door be mounted on a side face for improved cleanliness. In contradistinction, FIG. 1 showing a prior art carrier depicts a top mounted door that allows any contaminants to fall or be drawn into the product compartment.

An acrylic door panel, typically 0.25" thick, provides visual observation and would typically be amber in color for semiconductor product. A continuous door gasket 36 is fitted into a shallow groove routed into the face material around the container opening. The door gasket is non-shedding, typically silicone, and provides an air tight seal when the door 30 is closed. The gasket may be pressed fit or glued into place.

Figure 3A:
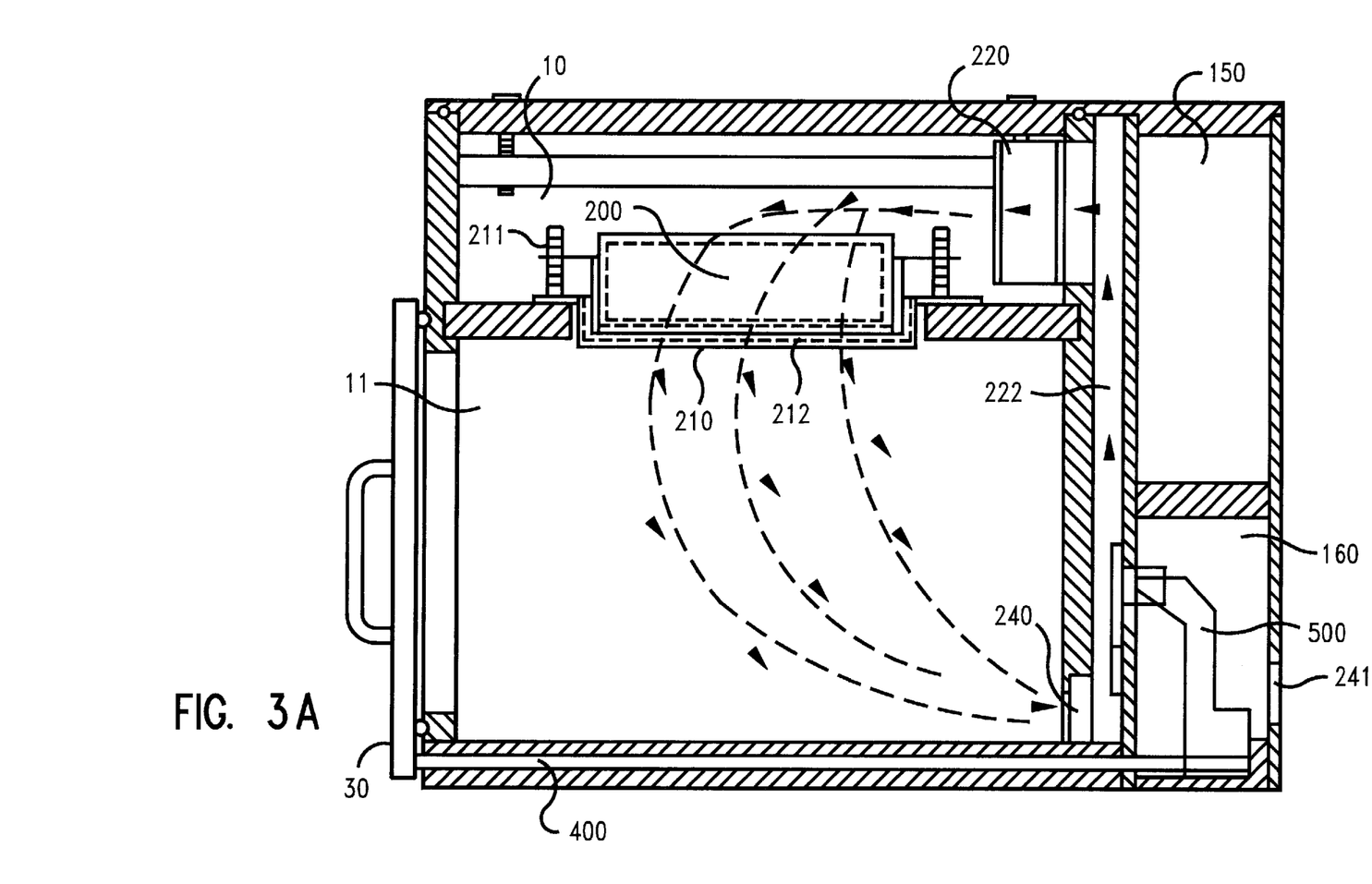
FIG. 3A is a vertical cross-sectional view through the middle of the transport container shown in FIG. 2 with the door closed.

FIGS. 3A through 6B illustrate several cross-sectional views of the internal construction and shows the relative positioning of the various elements that comprise the clean transport container. More particularly, FIG. 3A shows a side view of the container through the middle. The internal volume of the container is subdivided into several compartments: the product compartment 11 to house items being transported or stored, a filter/fan compartment 10, a battery compartment 150, and the damper mechanism compartment 160.

Within the filter/fan compartment 10 are located one or more fans 220, the HEPA or ULPA filter 200, a chemical filter (not shown) attached to the top of filter 200, and the filter mounting frame 210. Screws 211 hold filter 200 against filter gasket 212 making an air tight seal.

Within the battery compartment 150 are located the rechargeable battery (not shown) and all wiring to the control block 51 and the fans 220.

Within the damper compartment 160 is located the damper assembly 500 which switches the air flow from recirculation with door 30 closed to once through with door 30 open. The damper control rod 400 provides a connection between the door 30 and the damper assembly 500. The damper assembly is shown in detail in FIG. 6A and 6B.

Figure 3B:
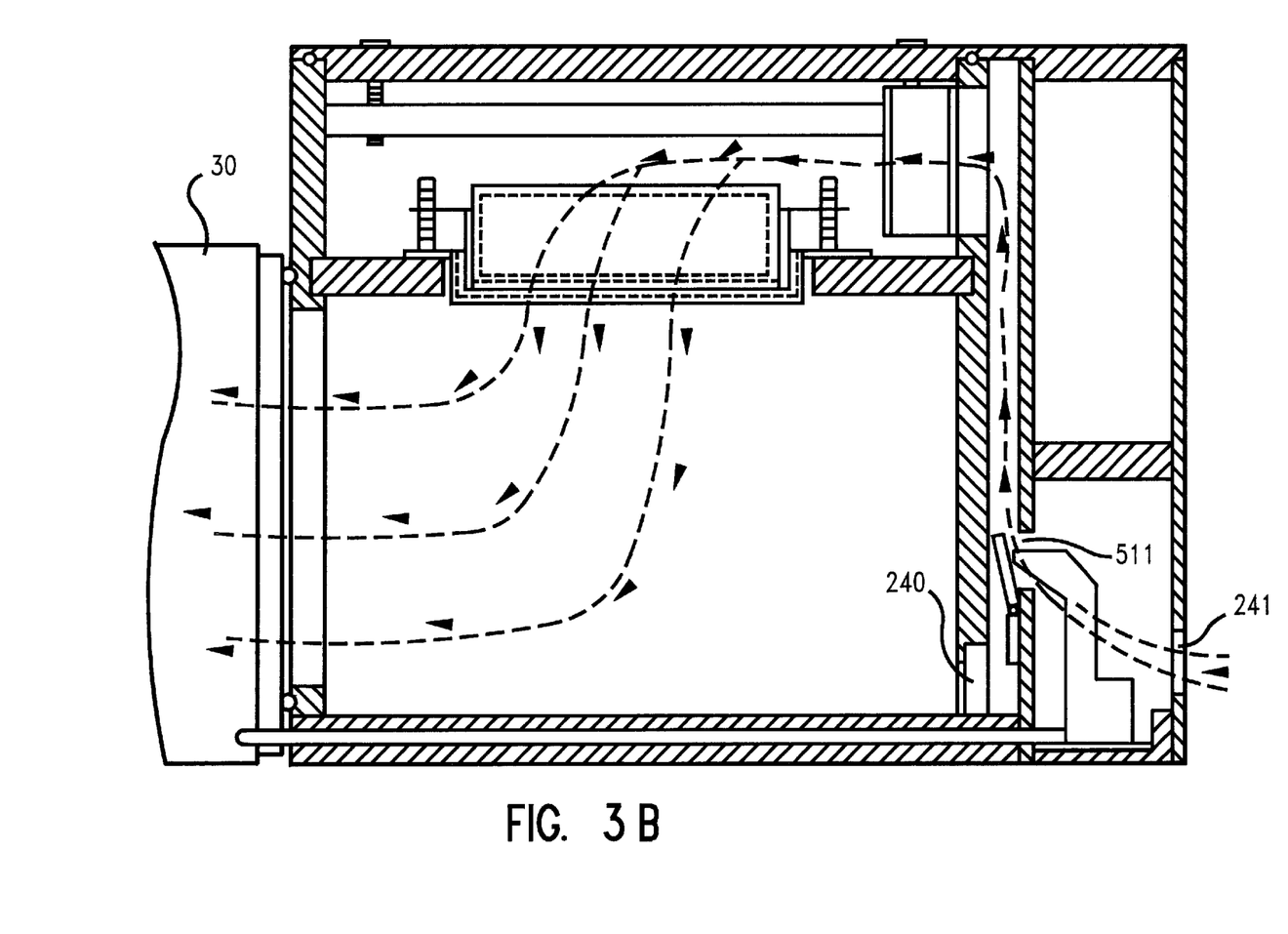
FIG. 3B is a vertical cross-sectional view through the middle of the transport container shown in FIG. 2 with the door open.

The air flow pattern in recirculation mode is shown in FIG. 3A and in "once through air" mode when door 30 is opened in FIG. 3B. While recirculating, air is forced through filter 200 by fan 220 into the product compartment 11, then through return air slot 240 and back to fans 220 via air plenum 222. In "once through" mode, FIG. 3B, damper assembly 500 opens, preventing air from moving through slot 240. Air is drawn from outside air port 241 through plenum 222 to fans 220, through filter 200, into product compartment 11, and finally out door 30. Positive air pressure (i.e., air is pushed outwardly) is maintained in the product compartment relative to the outside, preventing undesired outside air from entering through the access door.

Figure 4:
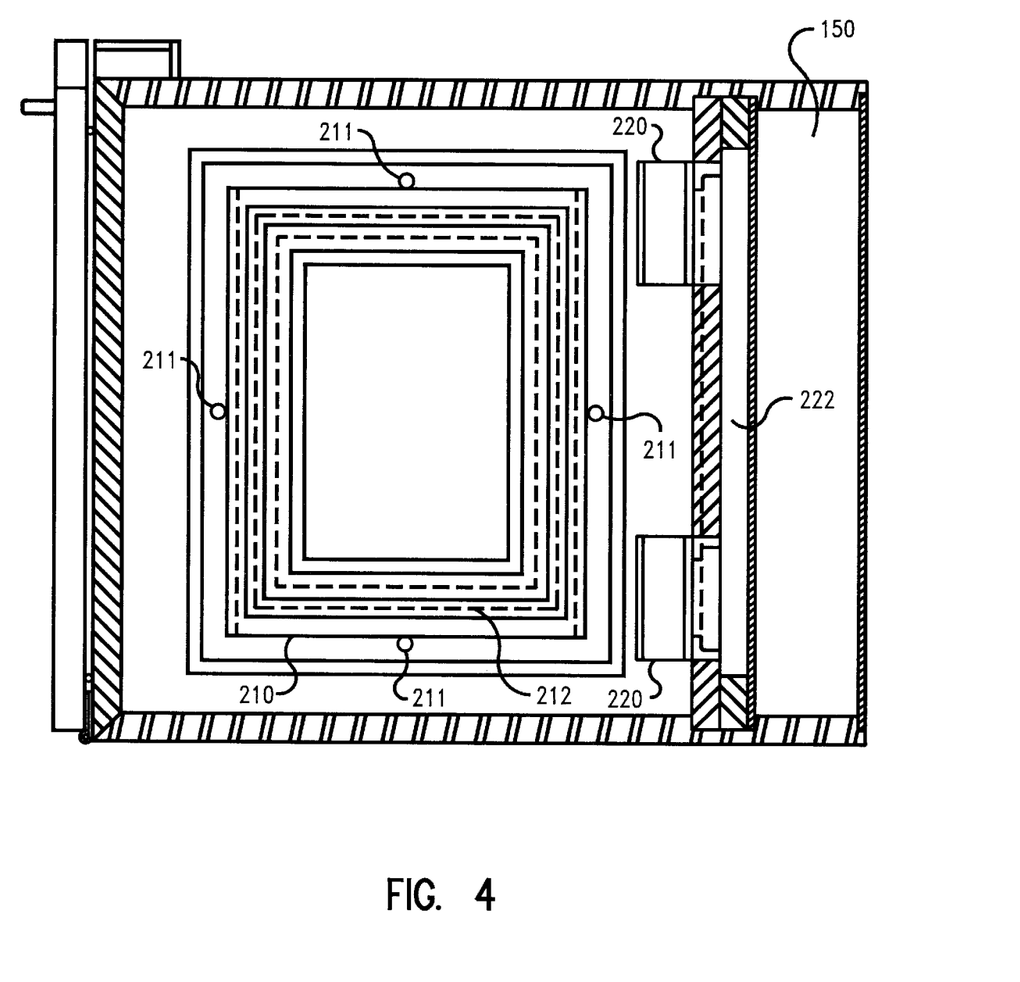
FIG. 4 is a top-down view of the filter/fan compartment; shown in FIG. 2.

Referring now to FIG. 4, there is shown a top view of the inside of the filter/fan compartment once the container top has been removed. A filter frame and housing 210, preferable made of stainless steel or anodized aluminum, holds the HEPA or ULPA filter 200 and filter gasket 212. Preferably, screws 211 tightened by hand pressure seats filter 200 against a gasket seal 212. Fans 220 are mounted vertically on the partition separating the battery compartment 150 from the filter/fan compartment 10 and in communication with air plenum 222.

The position of the filter with respect to the product is of prime importance. By placing the filter over the product, smooth laminar air flow can be achieved. In contradistinction, prior art transport carriers as in FIG. 1 utilize horizontal air flow that generate turbulence as the air impacts the side of the product. Smooth air flow is important to delicate parts such as X-ray lithography mask membranes.

The preferred embodiment provides an active air flow by utilizing a particulate filter and the two fans, generates an air flow of approximately 14 linear feet/min and more than 2,000 air changes per hour.

Figure 5:
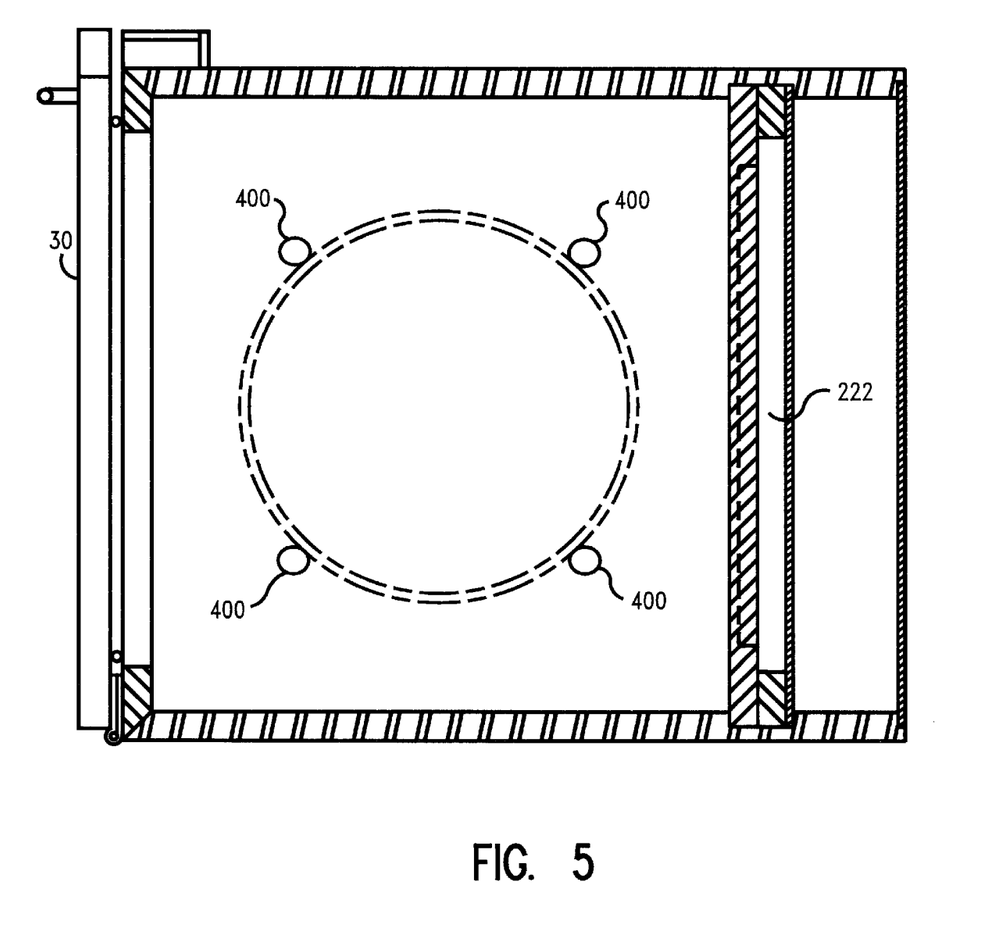
FIG. 5 is a top-down view of the product compartment shown in FIG. 2.

Referring now to FIG. 5, there is shown a horizontal cross-sectional view of the product compartment of the container. To properly hold X-ray masks, an area approximately 7.5 inches in diameter is surrounded by a set of eccentric mounted pins 400 allowing for adjustment when holding an X-ray mask. Other pin locations or holders for different products may also be used.

Figure 6A:
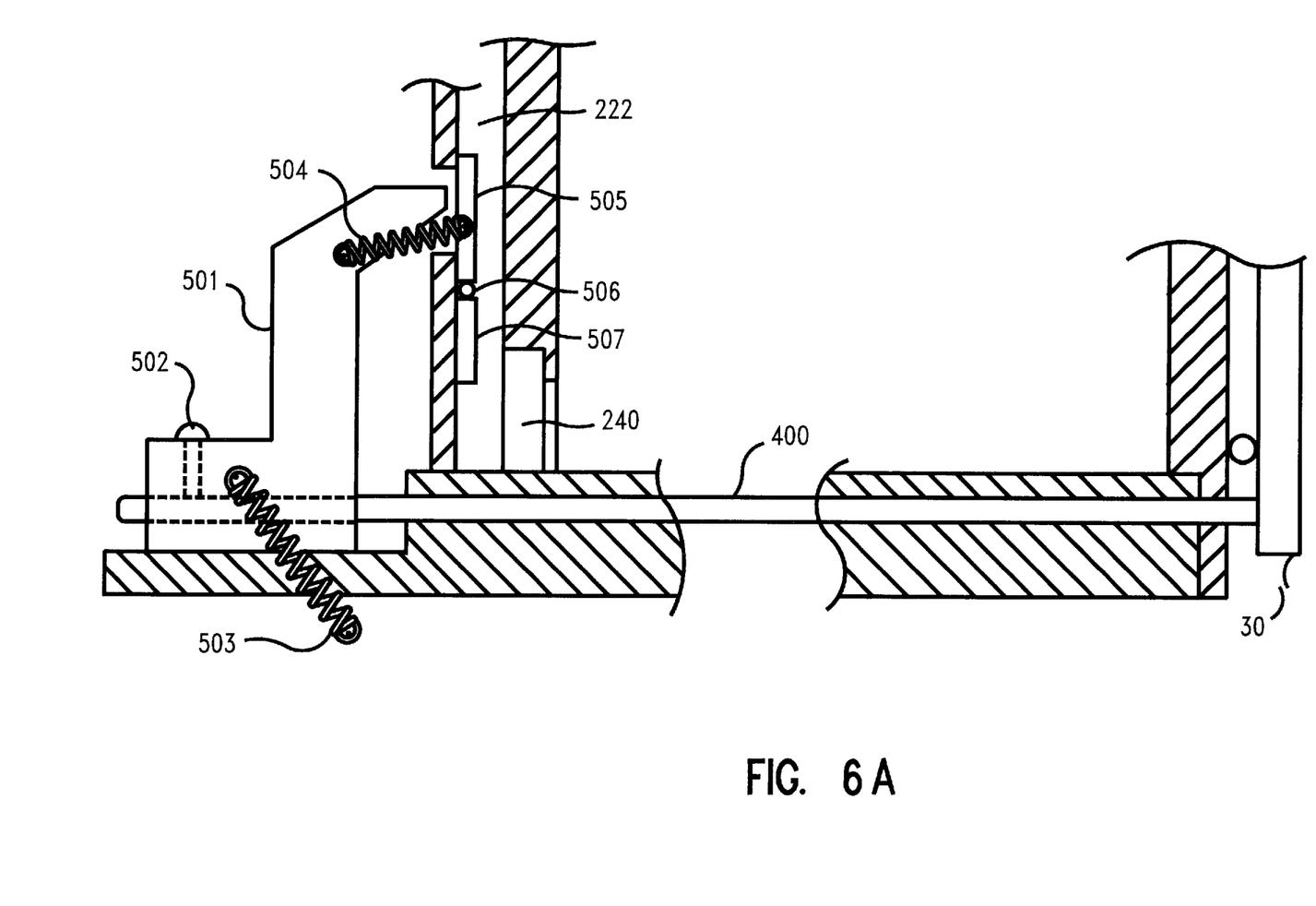
FIG. 6A is a schematic diagram of the damper mechanism activated by the door of the container with the door closed.
Figure 6B:
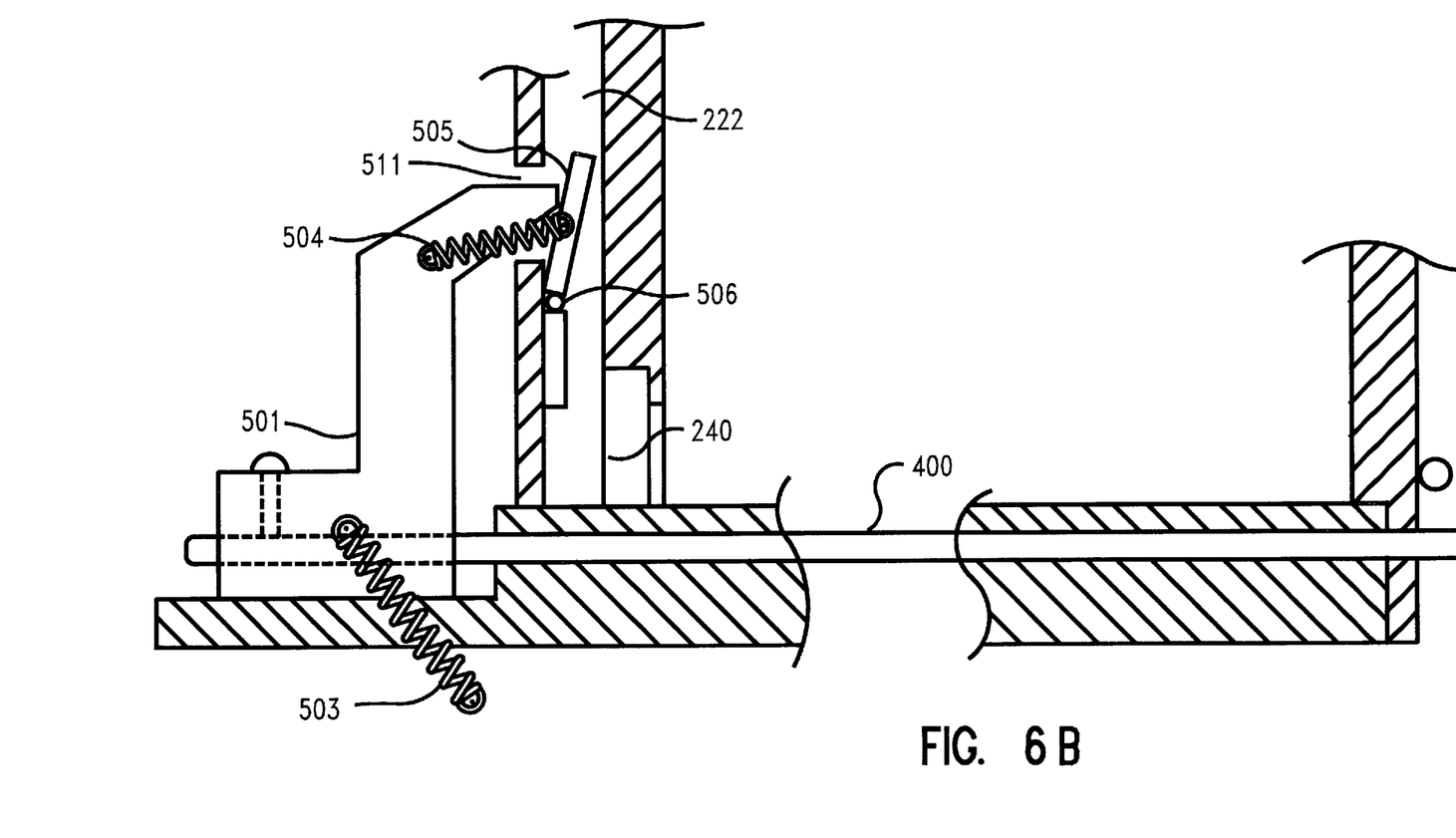
FIG. 6B is a schematic diagram of the damper mechanism activated by the door of the container with the door open.

FIGS. 6A and 6B represent a schematic diagram of the damper mechanism 500 located in the damper compartment 160 of FIG. 3A. FIG. 6A shows the damper in the closed position, whereas FIG. 6B shows it in the open position. In FIG. 6A, when the door 30 is closed to recirculate the air, the door pushes rod 400 which is attached to damper activator 501 by set screw 502. Activator return spring 503, attached at one end to activator 501, and at the other, to a convenient place inside the damper compartment, is under tension. Damper return spring 504, being attached at one end to activator 501 and at the other to damper 505, pulls and holds damper 505 closed, allowing air to be drawn through slot 240 into plenum 222. Damper 505 is mounted to hinge 506, of which one end 507 is fixed.

Referring now to FIG. 6.BA, when door 30 is opened for "once through" mode, return spring 503 pulls activator 501 forward which in turn pushes damper 505 open. Damper 505 then blocks air from moving through slot 240. Note that outside air port 241 in FIG. 3B and the slot 511 that activator 501 in FIG. 6B extending into both, are approximately ¾ the width of plenum 222, as seen from FIG. 4.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A transport and storage carrier, comprising:
    a sealable box having an access door, said access door being sealed when said door is in a closed position; and
    air circulating means for creating a positive air pressure in said box when said access door is open and for circulating air in said box when said box is in its closed position.

2. The transport and storage carrier of claim 1 further comprising filtering means for filtering said circulating air.

3. The transport and storage carrier of claim 2, wherein said filtering means are positioned over a product to be transported.

4. The transport and storage carrier of claim 2, wherein said filtering means is a chemical filter providing chemical filtration.

5. The transport and storage carrier of claim 1, wherein said air circulating is controlled by a damper.

6. The transport and storage carrier of claim 5, wherein said damper is rigidly attached to a frame, said frame being attached to said box.

7. The transport and storage carrier of claim 5, wherein said damper faces said access door.

8. The transport and storage carrier of claim 1, wherein said air circulating means is at least one fan.

9. The transport and storage carrier of claim 8, wherein said at least one fan is powered by a battery.

10. The transport and storage carrier of claim 8, wherein said at least one fan is powered by an external power supply.

11. The transport and storage carrier of claim 1, wherein said positive air pressure forces filtered air through said access door, when said access door is open.

12. The transport and storage carrier of claim 1, wherein said circulating air switches to once through air when said access door opens.

13. The transport and storage carrier of claim 12, wherein said once through air reverts to said circulating air when said access closes.

14. A transport and storage carrier, comprising:
a sealable box having an access door, said access door being sealed when said door is in a closed position;
air circulating means for creating a positive air pressure in said box when said access door is open and for circulating air in said box when said box is in its closed position; and
filtering means for filtering said circulating air.

15. The transport and storage carrier of claim 14, wherein said filtering means is selected from the group consisting of an HEPA air filter and an ULPA air filter.

16. The transport and storage carrier of claim 14, wherein said filtering means is horizontally positioned and placed over a product to be transported, and is rigidly attached to said frame.

17. The transport and storage carrier of claim 14, wherein said circulating means is at least one brushless fan.

18. The transport and storage carrier of claim 17, wherein said brushless fan is powered by a battery.

19. The transport and storage carrier of claim 18, wherein said battery is rechargeable.

20. The transport and storage carrier of claim 17, wherein said fan is powered by an external power supply.

21. The transport and storage carrier of claim 16, wherein said product is attached to said box by fastening means.

22. A carrier for the transport and storage from a first clean environment to a second clean environment passing through a less clean environment, the carrier comprising:
a box having an access door, said door being sealed in a closed position;
at least one fan inside of said box;
at least one air filter;
a power source coupled to said at least one fan; characterized in that said at least one air filter is securely held in position over a product to be transported by a frame placed horizontally inside of said box; and
a damper mechanism operating said access door to inhibit outside air from entering the carrier when said access door is opened and maintain an inside air pressure which is independent of the air pressure outside the carrier when said access door is closed.

23. The carrier of claim 22, wherein air circulates within said box, when said access door is closed, and said circulating air converts to once through air when said access door opens.

24. The carrier of claim 22, wherein said fan creates a positive flow, forcing air out of said box when said access door opens.

25. The carrier of claim 22, wherein the damper mechanism is connected to a damper activator.

26. The carrier of claim 25, wherein said damper activator is connected to said access door, such that air is switched from a recirculating mode with said access door is closed to once through air mode when said access door opens.

27. The carrier of claim 25, wherein said connection between said damper mechanism and said damper activator is an elastic attachment.

28. The carrier of claim 26, wherein said connection between said damper activator and said access door is an elastic attachment.

29. The carrier of claim 28, wherein said connection is a pivotal rod.

30. The carrier of claim 28, wherein said connection is a spring.

31. The transport and storage carrier of claim 1, wherein air pressure inside the carrier is independent of the air pressure outside the carrier when said access door is in a closed position.

32. The transport and storage carrier of claim 14, wherein air pressure inside the carrier is independent of the air pressure outside the carrier when said access door is in a closed position.

* * * * *